June 16, 1959 E. Y. POLITI ET AL 2,891,159

PHASE SHIFT OSCILLATOR

Filed Nov. 5, 1956

*INVENTORS*
EDWARD Y. POLITI
MERRITT T. WILLIAMS

By George Sullivan
Agent

United States Patent Office 2,891,159

Patented June 16, 1959

2,891,159

PHASE SHIFT OSCILLATOR

Edward Y. Politi, Reseda, and Merritt T. Williams, Mountain View, Calif., assignors to Lockheed Aircraft Corporation, Burbank, Calif.

Application November 5, 1956, Serial No. 620,341

2 Claims. (Cl. 250—36)

This invention relates generally to phase shift oscillators and more particularly to a temperature stabilized transistor resistance-inductance-capacitance phase shift sine wave oscillator.

It is an object of this invention to provide a transistorized phase shift oscillator, the frequency stability of which is substantially independent of the transistor parameter changes as a function of ambient temperature and time. Since transistors are notably temperature sensitive, this is a substantial improvement over prior art transistor oscillators wherein the transistor parameters directly effect oscillator frequency stability. For airborne telemetering applications and the like, this object of the applicants' invention is of extreme importance since operation under widely varying temperatures is encountered.

Another object of this invention is to provide a phase shift oscillator, the frequency of which is determined by resistive elements of small size permitting the oscillator to be miniaturized to a greater extent than those of the Hartley, Colpitts and other types which utilize capacitors and inductors as the major frequency determining elements in the circuit.

Another object of this invention is to provide a phase shift oscillator which employs a transistor as the active amplifier to povide the advantages of operating at low power with ruggedness and freedom from shock, vibration and acceleration sensitivity.

Still another object of this invention is to provide a transistorized phase shift oscillator which may be used with any inductive type transducer to convert physical inputs such as pressure, acceleration, force or distance into an electrical signal suitable for transmission to a remote location using conventional radio broadcast techniques.

Further and other objects will become apparent from a reading of the following description, especially when considered in combination with the accompanying drawing, wherein like numbers refer to like parts.

Figure 1:
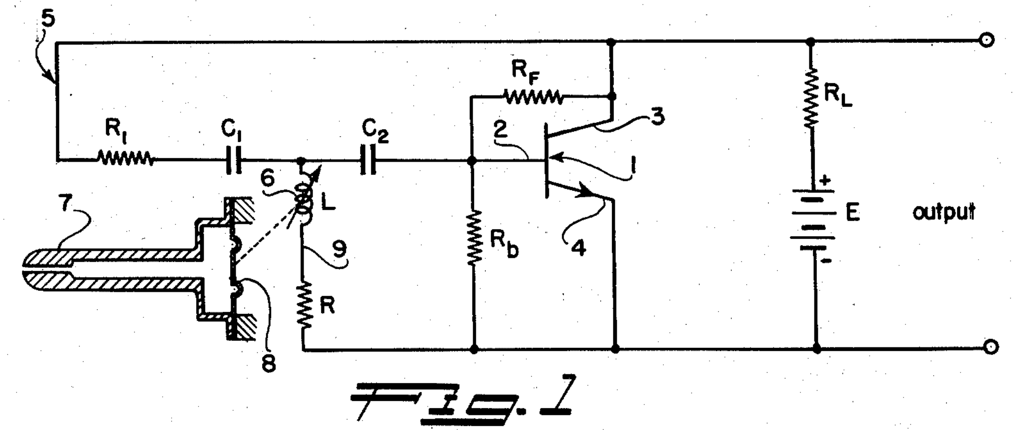
Figure 1 is a circuit schematic of the phase shift oscillator.

The oscillator as shown in Figure 1 includes a transistor 1 having a base 2, a collector 3 and an emitter 4. As shown, the transistor is of the N–P–N type, however this is for illustrative purposes and it is to be understood that a P–N–P type transistor will work equally well when the battery potential is reversed. Collector 3 of transistor 1 connects with the positive terminal of a suitable source of direct current potential as represented by battery E through a load resistor $R_L$. A phase shift positive feedback network 5 which includes resistor $R_1$, capacitors $C_1$ and $C_2$, inductance L and a resistance R connects collector 3 with base 2 of the transistor to cause oscillation.

The resistance R is the equivalent of any resistance that may exist in the inductor winding 6 and is shown in series with the winding which is shunt coupled into the phase shift network between capacitors $C_1$ and $C_2$. The negative terminal of battery E is connected to the free end 9 of winding 6 to complete the inductance circuit.

Either $R_1$, $C_1$, $C_2$ or L may be varied to adjust the oscillator frequency. Winding 6 is shown as being variable and mechanically coupled to a physical input device such as Pitot tube 7 which directs ram air pressure onto a diaphragm 8 which mechanically varies the air gap of a variable reluctance transducer so as to vary the inductance L of winding 6 in accordance with the variation in the magnitude of the ram air pressure. By this means the oscillator is frequency modulated to represent the physical input to the transducer which is, in the instant case, pressure. Obviously, any type of transducer may be employed with the oscillator to vary the inductance L.

A resistor $R_f$ coupling collector 3 with base 2 of the transistor provides negative feedback to limit the amplitude of the oscillations so as to prevent distortion. This resistor $R_f$ also acts as a biasing device to supply direct current to the base of the transistor. A resistor $R_b$ coupling base 2 with the negative terminal of battery E is used as a base current bleeder to control the base to emitter direct current voltage for isolation of the parameters of the transistor which vary as a function of temperature and also to permit establishing a value for the resistance of $R_f$ which is small enough to provide sufficient negative feedback for good sine wave oscillation. Emitter 4 of transistor 1 is connected to the negative terminal of battery E to complete the oscillator circuit.

Figure 2:
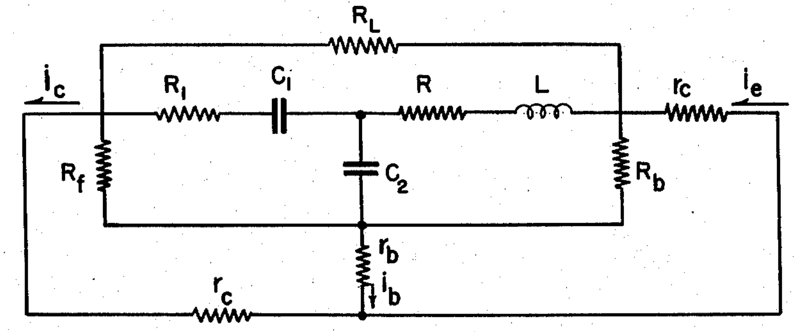
Figure 2 is an equivalent alternating current circuit for the oscillator as shown in Figure 1.
Figure 3:
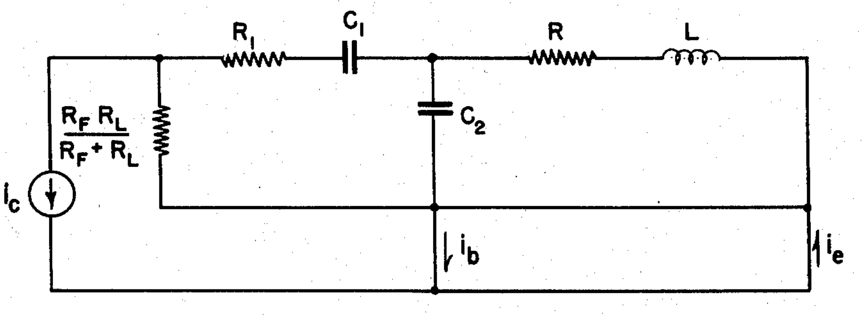
Figure 3 is a simplified equivalent alternating current circuit for the oscillator as shown in Figure 1.

To permit an analysis of the Figure 1 device, an equivalent alternating current circuit is shown in Figure 2 wherein $i_c$, $i_e$ and $i_b$ represent the collector, emitter and base currents respectively for the transistor and $r_c$, $r_e$ and $r_b$ represent the collector, emitter and base resistances of the transistor. Since the following reasonable assumptions can be made for contemporary transistors: (1) The collector resistance, $r_c$ is very large so as not to effect the rest of the network shown in Figure 2; (2) $r_e$ and $r_b$ are negligibly small; the Figure 2 equivalent circuit may be simplified to that shown in Figure 3. Through successive transformations to simplify the network and by considering the loop gain to be equal to unity as is required for stable oscillations to occur, the frequency of oscillation is found to be $$f=\frac{1}{2\pi}\left[\frac{R_L+R_F(1-\alpha)}{R_L[(R_F+R_1)RC_1C_2+L(C_1+C_2)]+R_F(1-\alpha)}\right]^{1/} \quad (1)$$

where $$\alpha=\frac{I_c}{I_e}=\text{transistor current gain}$$

Furthermore, for a transistor having a high current gain, that is, $\alpha$ approaching unity, the frequency of oscillation simplifies to $$f=\frac{1}{2\pi}\left[\frac{1}{(R_F+R_1)RC_1C_2+L(C_1+C_2)}\right]^{1/2} \quad (2)$$

It is apparent from Equation 2 that the frequency stability of the oscillator when using a transistor having a current gain nearly equal to unity will be substantially independent of the transistor parameters which change as a function of ambient temperature and time. It is also apparent from this equation that the frequency is decreased as the resistors $R_1$ and $R_f$ are increased. Thus, for telemetering applications where the allotted frequency range is between 400 cycles per second to 70,000 cycles per second, the oscillator can be miniaturized to a much greater extent than those of the Hartley, Colpitts and other types which require larger size condensers and inductors.

In operation a transducer such as the pressure transducer shown in Figure 1 which includes Pitot tube 7 and a flexible diaphragm 8 is magnetically coupled to the variable reluctance coil 6 to cause the inductance L to vary with the physical force being detected. The change in inductance changes the amount of phase shift introduced in the feedback loop by the phase shift network causing a change in the operating frequency of the oscillator from the center frequency which is previously established by adjustment of $R_1$, $C_1$, $C_2$ and $R_f$. It shall be noted however that since resistor $R_f$ is a part of the direct current circuit for the transistor which isolates the parameters varying as a function of temperature, it is better to vary $R_1$, $C_1$ or $C_2$ to obtain the desired oscillator center frequency. The frequency modulated output of the oscillator may be amplified and employed as the input to a conventional transmitter (not shown) or directly to data recording apparatus (not shown) utilizing standard techniques.

The oscillator described herein designed as part of an airborne telemetering system may be easily packaged within one cubic inch of space. Based on actual tests, the frequency drift is less than 1 percent of bandwidth from −20° C. to +80° C. (−4° F. to +76° F.). This represents less than .15 percent frequency drift over the entire temperature range. Also of importance is the ruggedness of the circuit. With the test oscillator mentioned, no shock sensitivity of any kind could be detected at acceleration loads as high as 500 *g*'s. These operating characteristics of the oscillator circuit make it extremely useful under rugged environmental conditions where reliability and a high degree of miniaturization is required.

It is to be understood that certain alterations, modifications and substitutions may be made to the instant disclosure without departing from the spirit and scope of the invention as defined by the appended claims.

We claim:

1. A phase shift oscillator comprising, a transistor having a base, a collector and an emitter, a source of direct current potential, a load resistor coupling the source of direct current potential with said collector, a positive feedback phase shift network coupling the collector with said base, said phase shift network including variable inductance means responsive to a physical input for varying the magnitude of the phase shift and changing the operating frequency of the oscillator, a negative feedback biasing resistor bypassing said phase shift network and coupling the base with said collector to limit the amplitude of the oscillations and provide the base with a source of direct current, and a resistor coupling the base with ground to control the base to emitter direct current voltage for establishing a direct current operating level for the transistor substantially isolating the parameters which vary as a function of temperature and maintain sufficient negative feedback through said biasing resistor for stable sine wave oscillation.

2. A phase shift oscillator comprising, a transistor having a base, a collector and an emitter, a source of direct current potential, a load resistor coupling the source of direct current potential with said collector, a positive feedback loop coupling the collector with said base, said loop including a series coupled resistor-capacitor phase shift network, a variable inductance means coupled in parallel to said phase shift network and being responsive to the application of a physical quantity for changing the inductance and varying the magnitude of the phase shift in the feedback loop whereby the oscillator operating frequency is modified in accordance with the change in inductance, a negative feedback biasing resistor bypassing said phase shift network and coupling the base with said collector to limit the amplitude of the oscillations and provide the base with a source of direct current, and resistor means coupling the base with said emitter and with ground to control the base to emitter direct current voltage for establishing a direct current operating level for the transistor substantially isolating the parameters which vary as a function of temperature and maintain sufficient negative feedback through said biasing resistor for stable sine wave oscillation.

References Cited in the file of this patent

UNITED STATES PATENTS

| | | |
|---|---|---|
| 2,473,610 | Rieber | June 21, 1949 |
| 2,675,540 | Schultheis | Apr. 13, 1954 |
| 2,751,501 | Eberhard | June 19, 1956 |

OTHER REFERENCES

"Transistorized Phase-Shift Oscillator," page 108 of Radio and Television News, vol. 55, No. 4, April 1956.